(12) United States Patent
Son

(10) Patent No.: US 8,323,413 B2
(45) Date of Patent: Dec. 4, 2012

(54) SUSCEPTOR AND SEMICONDUCTOR MANUFACTURING APPARATUS INCLUDING THE SAME

(75) Inventor: Hyo Kun Son, Gwangju (KR)

(73) Assignee: LG Innotek Co., Ltd, Seoul (KR)

( * ) Notice: Subject to any disclaimer, the term of this patent is extended or adjusted under 35 U.S.C. 154(b) by 944 days.

(21) Appl. No.: 11/916,005

(22) PCT Filed: Mar. 9, 2007

(86) PCT No.: PCT/KR2007/001163
§ 371 (c)(1),
(2), (4) Date: Nov. 29, 2007

(87) PCT Pub. No.: WO2007/105877
PCT Pub. Date: Sep. 20, 2007

(65) Prior Publication Data
US 2009/0314209 A1    Dec. 24, 2009

(30) Foreign Application Priority Data
Mar. 14, 2006    (KR) .................. 10-2006-0023354

(51) Int. Cl.
C23C 16/00     (2006.01)
C23C 16/50     (2006.01)
C23F 1/00      (2006.01)
H01L 21/306    (2006.01)

(52) U.S. Cl. ........ 118/730; 118/715; 118/724; 118/725; 118/728; 118/729; 156/345.51; 156/345.52; 156/345.54; 156/345.55

(58) Field of Classification Search .......... 118/728, 118/729, 730, 731, 732; 156/345.51, 345.52, 156/345.53, 345.54, 345.55
See application file for complete search history.

(56) References Cited

U.S. PATENT DOCUMENTS

| | | | | |
|---|---|---|---|---|
| 3,633,537 A | * | 1/1972 | Howe | 118/725 |
| 4,100,879 A | * | 7/1978 | Goldin et al. | 118/725 |
| 4,858,558 A | * | 8/1989 | Ohmura et al. | 118/725 |
| 5,785,764 A | * | 7/1998 | Hoshina et al. | 118/500 |
| 5,837,058 A | | 11/1998 | Chen et al. | |
| 2005/0022746 A1 | * | 2/2005 | Lampe et al. | 118/728 |

FOREIGN PATENT DOCUMENTS

| | | |
|---|---|---|
| JP | 55-153265 U | 5/1982 |
| JP | 10-074705 A | 3/1998 |
| JP | 2001-518238 A | 9/2001 |
| JP | 2004-207545 A | 7/2004 |
| KR | 10-2003-0007929 A | 1/2003 |

* cited by examiner

Primary Examiner — Parviz Hassanzadeh
Assistant Examiner — Tiffany Nuckols
(74) Attorney, Agent, or Firm — Birch, Stewart, Kolasch & Birch, LLP

(57) ABSTRACT

A susceptor and a semiconductor manufacturing apparatus including the same are provided. A wafer is loaded on a susceptor and the susceptor includes at least one pocket whose bottom surface is inclined. The semiconductor manufacturing apparatus includes a reaction chamber, a heating unit that generates heat in the reaction chamber, a susceptor on which a wafer is loaded and that includes at least one pocket whose bottom surface is inclined, and a rotation shaft coupled with the susceptor.

8 Claims, 5 Drawing Sheets

(a)

(b)

(a)

(b)

(a)

(b)

US 8,323,413 B2

SUSCEPTOR AND SEMICONDUCTOR MANUFACTURING APPARATUS INCLUDING THE SAME

TECHNICAL FIELD

The embodiment relates to a susceptor and a semiconductor manufacturing apparatus including the same.

BACKGROUND ART

In general, a semiconductor manufacturing apparatus includes a crystal growth equipment, such as a metal organic chemical vapor deposition (MOCVD) apparatus, a molecular beam epitaxy (MBE) apparatus, and a chemical vapor deposition (CVD) apparatus. Such a crystal growth equipment is used for growing an element, such as a semiconductor light emitting device, a high electron mobility transistor (HEMT), a field effect transistor (FET), and a laser diode on the surface of a wafer.

A susceptor of vacuous type is commonly used as an apparatus for loading a wafer in the crystal growth equipment.

FIG. 1 schematically illustrates a related art semiconductor manufacturing apparatus. Referring to FIGS. 1 and 2, a semiconductor manufacturing apparatus 10 includes a reaction chamber 20, a susceptor 30, a rotation shaft 50, a heater 60, and a shroud 70. A plurality of pockets 34 are formed in the top surface of the susceptor 30 in the reaction chamber 20 and a wafer 40 is loaded on each of the pockets 34. Here, as illustrated in FIG. 2B, the bottom surface 38 of the pocket 34 has a horizontal structure. The rotation shaft 50 is coupled with the under part of the susceptor 30 and the heater 60 is provided under the susceptor 30 to heat the under part of the susceptor 30. The shroud 70 on the reaction chamber 20 supplies source materials to the reaction chamber 20.

Processes of manufacturing a semiconductor using the semiconductor manufacturing apparatus are as follows.

The wafer 40 is loaded on the pocket 34 of the susceptor 30. The source materials are supplied to the reaction chamber 20 through the shroud 70. The susceptor 30 rotates by the rotation shaft 50. The susceptor 30 and the inside of the reaction chamber 20 are heated by the heater 60. At this time, a semiconductor thin film or an insulating layer is formed on the surface of the wafer 40 by the chemical reaction of the flowed source materials.

At this time, an aluminum nitride layer, a gallium nitride layer, and an indium nitride layer or an aluminum-gallium nitride layer, an aluminum-indium nitride layer, and a gallium-indium nitride layer can be deposited on the surface of the wafer 40 loaded on the susceptor 30 by a vapor reaction between organic metal and ammonia.

The heat generated by the heater 60 heats a region having the same radius based on the rotation shaft 50 of the susceptor 30 at a uniform temperature but cannot heat a region having a different radius at the uniform temperature. Therefore, since the rotation shaft 50 positioned in the center of the susceptor 30 transfers the heat in the center of the susceptor 30, a difference in temperature is generated between the center region and the outer region of the susceptor 30. Temperature is reduced from the center point of the pocket toward the inner point of the pocket as illustrated in the before modification susceptor graph of FIG. 9.

As a result, a difference in temperature is generated on the surface of the wafer loaded on the susceptor 30. Therefore, the outer region and the inner region of the epitaxial layer deposited on the wafer have different growth speeds. Accordingly, emission wavelength deviation is generated in the semiconductor light emitting devices produced in one wafer and the thicknesses of a material layer grown in one wafer vary a lot in accordance with regions.

As described above, the ranges of the emission wavelengths of the semiconductor devices produced on one susceptor or one wafer are not uniform but are various.

DISCLOSURE

Technical Problem

An embodiment of the present invention provides a susceptor by which a thin film of a uniform thickness can be formed on a wafer and a semiconductor manufacturing apparatus including the same.

An embodiment of the present invention provides a susceptor by which it is possible to improve the light intensity of a semiconductor light emitting device and a semiconductor manufacturing apparatus including the same.

An embodiment of the present invention provides a susceptor having inclined pockets and a semiconductor manufacturing apparatus including the same.

Technical Solution

A susceptor provided in a reaction chamber comprises at least one pocket whose bottom surface is inclined.

In a susceptor on which a wafer is loaded, a plurality of pockets are formed in the susceptor and at least one of the pockets is formed so that the bottom surface of the pocket is inclined.

A semiconductor manufacturing apparatus comprises a reaction chamber, a heating unit that generates heat in the reaction chamber, a susceptor on which a wafer is loaded and that includes at least one pocket whose bottom surface is inclined, and a rotation shaft coupled with the susceptor.

According to the embodiments, inclined pockets are provided in the susceptor so that it is possible to remove deviation in temperature of the surface of the wafer generated by the rotation shaft of the susceptor, to make the temperature of the wafer uniform, and to make the thickness of the material layer deposited on the surface of the wafer uniform.

Advantageous Effects

In the susceptor according to the embodiment and the semiconductor manufacturing apparatus including the same, since heat is uniformly transferred to the wafer, it is possible to form the uniform thin film on the surface of the wafer.

In addition, it is possible to reduce deviation in the electrical/optical characteristics of the semiconductor light emitting devices produced from the wafer loaded on the susceptor and to improve the yield of the semiconductor devices of each wafer.

In addition, since deviation in temperature of the surface of the wafer increases, it is possible to increase the light intensity of the semiconductor light emitting device.

BEST MODE

Embodiments of the present invention will be described with reference to the attached drawings.

Figure 1:
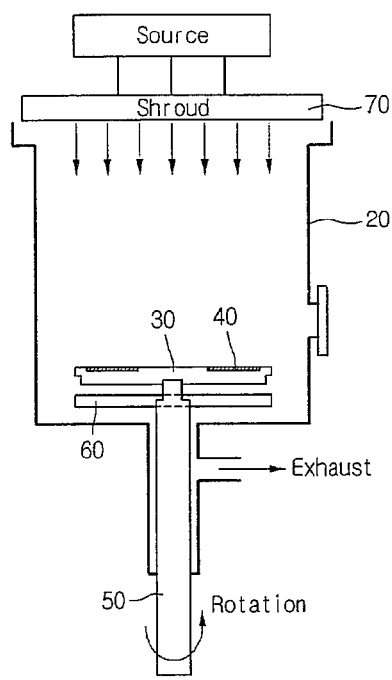
FIG. 1 is a sectional view illustrating a related art semiconductor manufacturing apparatus.
Figure 2:
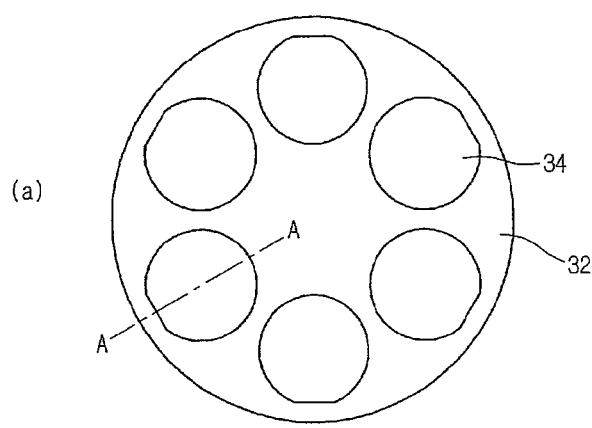
FIGS. 2A and 2B are a plan view of a conventional susceptor and a sectional view taken along the line A-A of the conventional susceptor.
Figure 2:
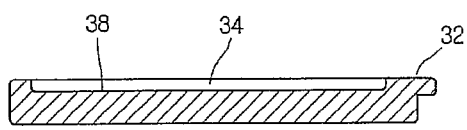
Figure 3:
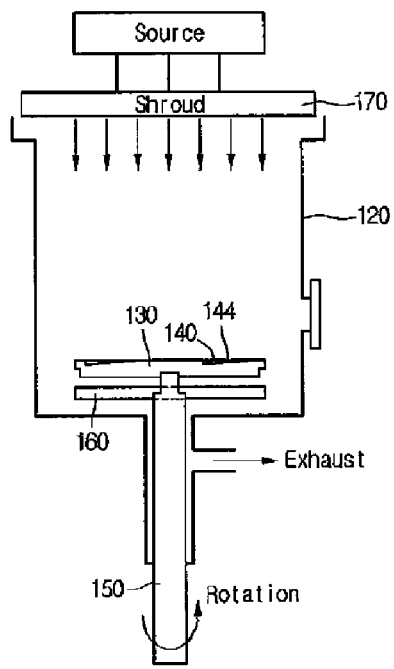
FIG. 3 is a sectional view illustrating a semiconductor manufacturing apparatus according to an embodiment of the present invention.
Figure 4:
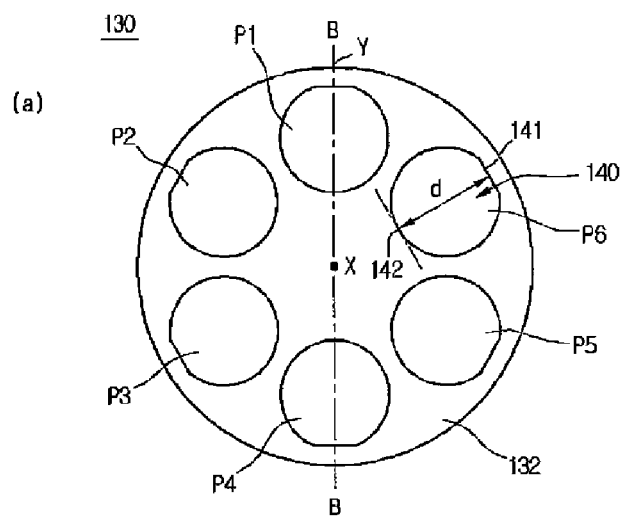
FIGS. 4A and 4B are a plan view of a susceptor according to an embodiment of the present invention and a sectional view taken along the line B-B of the susceptor.
Figure 4:
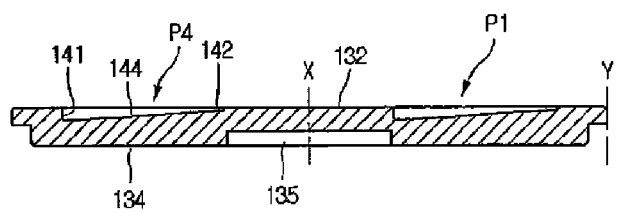
Figure 5:
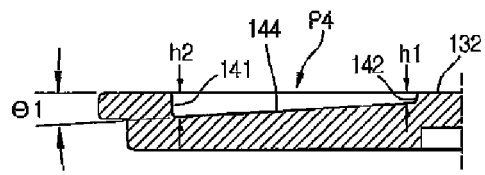
FIGS. 5A and 5B illustrate a pocket according to an embodiment of the present invention.
Figure 5:
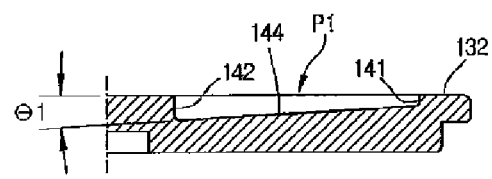

FIG. 3 is a sectional view of a semiconductor manufacturing apparatus according to an embodiment of the present invention. FIGS. 4A and 4B are a plan view of the susceptor of FIG. 3 and a sectional view taken along the line B-B of the susceptor. FIG. 5 illustrates a pocket in detail.

Referring to FIG. 3, a semiconductor manufacturing apparatus 100 includes a reaction chamber 120, a susceptor (or wafer carrier) 130, a rotation shaft 150, a heating unit 160 such as a heater, and a shroud 170.

The susceptor 130 is provided in the reaction chamber 120 and at least one pocket 140 is formed in the top surface of the susceptor 130. Here, the bottom surface of at least one of the pockets 140 is inclined.

A wafer (not shown) is loaded on the pocket 140 and the rotation shaft 150 is coupled with the under part of the susceptor 130 to rotate the susceptor 130. The heating unit 160 heats the under part of the susceptor 130 and the inside of the reaction chamber 120 at a predetermined temperature. The shroud 170 supplies source materials to the reaction chamber 120.

The source materials are supplied to the reaction chamber 120 through the shroud 170. The susceptor 130 in the reaction chamber 120 is rotated by the rotation shaft 150. The inside of the reaction chamber 120 and the susceptor 130 are heated by the heating unit 160. At this time, a semiconductor thin film or an insulating layer is formed on the surface of the wafer (not shown) by the chemical reaction of the flowed source materials.

As the surface of the pocket 140 of the susceptor 130 is inclined, the thickness of the susceptor is in inverse proportion to the depth or the degree of inclination of the bottom surface of the pocket 140. Accordingly, the heat transferred to the wafer through the susceptor 130 increases as the bottom surface of the pocket 140 is deeper and is reduced as the bottom surface of the pocket 140 is shallower.

Here, the semiconductor manufacturing apparatus 100 includes an apparatus such as a metal organic chemical vapor deposition (MOCVD) apparatus, a molecular beam epitaxy (MBE) apparatus, and a chemical vapor deposition (CVD) apparatus. An element such as a gallium nitride based semiconductor light emitting device, a high electron mobility transistor (HEMT), a field effect transistor (FET), and a laser diode is grown on the surface of the wafer (not shown) using such an apparatus.

The susceptor 130 is formed of carbon or aluminum nitride (AlN). The surface that contacts the wafer on the surface of the susceptor 130 and in the pocket 140 is coated with a silicon carbide (SiC) layer, a carbon layer, or an aluminum nitride (AlN) layer.

Here, the surface of the susceptor 130 is coated with the silicon carbide (SiC) layer or the aluminum nitride (AlN) layer so that it is possible to prevent the susceptor made of carbon from being damaged by chemical cleaning using hydrogen fluoride (HF) or thermal cleaning and to prevent the characteristic of the susceptor from deteriorating. Here, the deposition thickness of the silicon carbide layer or the aluminum nitride layer is preferably 10 Å to 10,000 Å.

As illustrated in FIGS. 4A and 4B, at least one pocket 140 can be formed on the top surface 132 of the susceptor 130. In the drawings, six pockets 140 P1 to P6 are formed. However, the present invention is not limited to the above.

1 to 50 or more pockets can be formed in the susceptor 130 in accordance with the size of the wafer or the capacity of the reaction chamber. In addition, one or more columns of pockets can be formed in the susceptor 130.

In the pocket 140, a flat part and a round part exist. The flat part is formed on the outer side of the pocket to prevent the wafer from rotating. The flat part of the pocket may be removed from the pocket.

Hereinafter, for convenience sake, the outermost end of the pocket 140 is referred to as an outer point 141 and the innermost end of the pocket 140 is referred to an inner point 142 based on the center X of the susceptor. In the pocket, the distance d between the inner point 142 and the outer point 141 is maximal. In the pocket 140, the flat part can be formed in the outer point 141 or the inner point or in other points.

The bottom surfaces 144 of the pockets P1 and P4 are inclined. The bottom surface 144 of the first pocket P1 is an inclined surface formed so that the inner point 142 is deeper than the outer point 141. The bottom surface 144 of the fourth pocket P4 is an inclined surface formed so that the outer point is deeper than the inner point 142. Like in the fourth pocket P4, the outer point 141 can be formed to be deeper than the inner point 142. Accordingly, deviation in the temperature of the surface of the wafer generated by the susceptor can be larger and the light intensity of the semiconductor light emitting device produced by the wafer can be improved.

The inclined bottom surfaces 144 of the pockets P1 and P4 affect the thickness between the top surface 132 of the susceptor 130 and the bottom surface 134 of the susceptor 130. That is, the thickness of the susceptor 130 varies in accordance with the inclined bottom surfaces 144 of the pockets P1 and P4. Here, a shaft coupling groove 135 is formed in the center of the under part of the susceptor 130.

In addition, in the susceptor 130, the bottom surfaces of the pockets P1, P2, and P3 can be inclined toward the inner point 142 and the bottom surfaces of the pockets P4, P5, and P6 can be inclined toward the outer point 141. The directions in which the bottom surfaces of the pockets P1 to P6 are inclined can varies in accordance with the distribution of the temperatures of the wafer loaded in the susceptor 130.

Referring to FIGS. 5A and 5B, the minimum depth h1 of the pocket P4 is no less than the thickness of the wafer and the maximum depth h2 of the pocket P4 can vary in accordance with the inclination angle.

The inner point 142 of the pocket P4 is the minimum depth h1 in the pocket and the outer point 141 of the pocket P4 is the maximum depth h2 in the pocket. In the pocket P1, the bottom surface 144 is inclined in the direction opposite to the direction in which the bottom surface 144 is inclined in the pocket P4.

Here, the inclination angle θ1 of the bottom surfaces 144 of the pockets P1 and P4 is set in the range of 0<θ1≦10° based on the top surface 132 of the susceptor. At this time, the maximum depth h2 in the pockets P1 and P4 can be no more than 10mm and the minimum depth h1 can be no less than the thickness of the wafer. Here, the depth or the angle of inclination of the bottom surfaces 144 of the pockets P1 and P4 can vary in accordance with the size of the wafer. For example, in the case of a 2-inch wafer, the depth of the bottom surfaces 144 of the pockets P1 and P4 can be formed to the maximum depth of about 3mm to about 5mm.

The inclined direction of the bottom surface 144 of the pocket P4 is opposite to the inclined direction of the bottom surface 144 of the pocket P1 and the inclination angle θ1 of the bottom surfaces 144 of the pocket P4 and the pocket P1 is the same.

Figure 6:
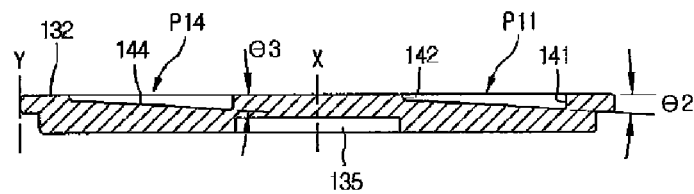
FIGS. 6 to 8 illustrate examples of the pockets of the susceptor according to an embodiment of the present invention.
Figure 7:
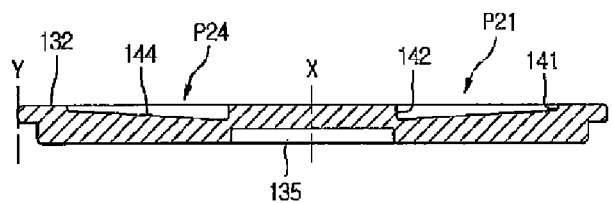
Figure 8:
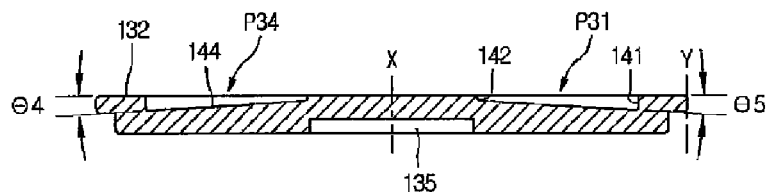

FIGS. 6 to 8 are sectional views illustrating a susceptor according to another embodiment of the present invention.

As illustrated in FIG. 6, the bottom surface 144 of a pocket P11 is inclined against the top surface 132 of the susceptor 130 by an angle of θ2 from the inner point 142 to the outer point 141. A pocket P14 is inclined against the top surface 132 of the susceptor 130 by an angle θ3 from the outer point 141 to the inner point 142. The inclination angles θ2 and θ3 of the bottom surfaces can be different from each other.

As illustrated in FIG. 7, pockets P21 and P24 have a structure in which the depth of the bottom surface increases toward the center X of the susceptor or the inner point 142. At this time, the bottom surfaces 144 of the pockets P21 and P24 can be inclined at the same angle or at different angles. Here, the two pockets P21 and P24 can be provided to correspond to each other.

As illustrated in FIG. 8, pockets P31 and P34 have a structure in which the depth of the bottom surface increases toward the outer side Y of the susceptor or the outer point 142. At this time, the inclination angles θ4 and θ5 of the bottom surfaces of the two pockets P31 and P34 can be equal to each other or different from each other. Here, the two pockets P31 and P34 can be provided to correspond to each other.

According to such an embodiment, the bottom surfaces of the pockets corresponding to each other can be inclined toward the inner point or the outer point in the susceptor. The inclination angle and the inclination direction of the bottom surfaces of the pockets formed in the susceptor may be selectively changed. In addition, even pockets and inclined pockets can be used together in one susceptor.

On the other hand, the operation of the semiconductor manufacturing apparatus including the above-described susceptor will be described with reference to FIGS. 3 to 5 as follows. According to the present invention, for convenience sake, the MOCVD apparatus is used.

A wafer is loaded on the inclined bottom surface of the at least one pocket 140 formed in the top surface of the susceptor 130. The heating unit 160 heats the inside of the reaction chamber 120 and the under part of the susceptor 130 and the rotation shaft 150 rotates the susceptor 130 at predetermined speed.

Here, the rotation shaft 150, as illustrated in FIG. 4B, is coupled with the shaft coupling groove 135 formed in the under part of the susceptor 130.

The inclination angle of the bottom surface of the pocket 140 is in the range of 0°<θ≦10° based on the top surface 132 of the susceptor 130.

Source gases and carrier gases are flowed to the reaction chamber 120 through the shroud 170 included to the reaction chamber 120. The carrier gases can include, for example, a trimethyl aluminum gas, an ammonia gas, and hydrogen or nitrogen. The trimethyl aluminum gas and the ammonia gas flowed through the shroud 170 are guided to the reaction chamber 120 so as not to react to each other. The temperature of the internal wall of the reaction chamber, in particular, the temperature of the upper part of the susceptor is increased by the heating unit 160 so that the wafer loaded on the top surface of the susceptor is heated at the temperature of about 1,000° C.

A gas phase reaction between the trimethyl aluminum gas and the ammonia gas occurs in the reaction chamber 120 so that, for example, aluminum nitride is effectively deposited on the wafer. Here, a change in the thickness of a material layer deposited on the surface of the wafer can be improved to about 1.8%.

As described above, since the wafer is loaded to be inclined by the inclined bottom surface of each pocket 140, it is possible to reduce a difference in temperatures by regions of the wafer. Therefore, the entire wafer is uniformly heated. In addition, the temperature of the wafer loaded on the susceptor 130 can be uniformly maintained, for example, to have deviation within ±2° C. based on reference temperature. Therefore, when the semiconductor light emitting devices produced from a wafer loaded on each pocket 140 in one susceptor 130 are compared with each other, the semiconductor light emitting devices having the same emission wavelength region in the entire region of the wafer can be produced. For example, the emission wavelength region of the semiconductor light emitting devices produced in the center region, the inner region, and the outer region of the wafer loaded on one pocket is about 455 nm. FIGS. 9 to 12 are graphs illustrating the examples of results of examining emission wavelength regions by light emitting diodes manufactured from one wafer by the above-described method.

Figure 9:
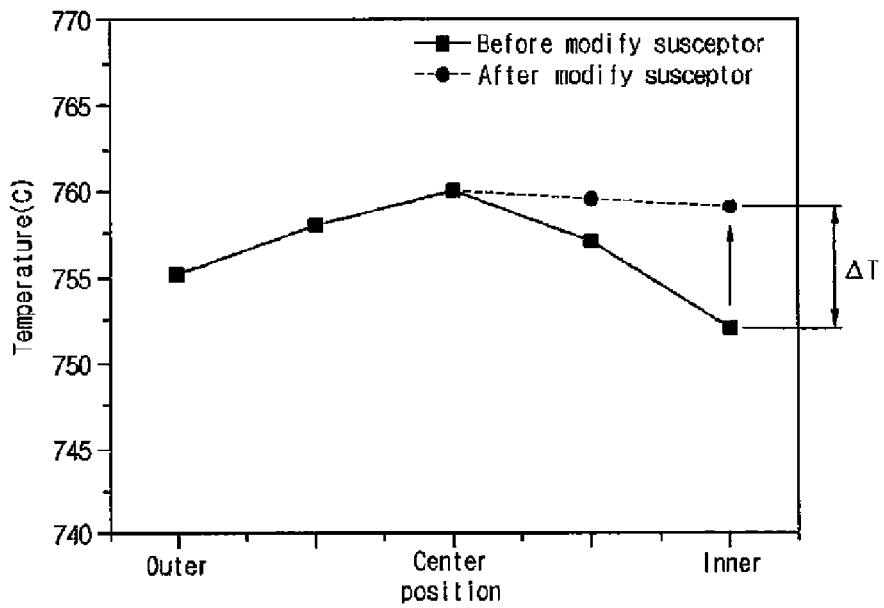
FIG. 9 is a graph in which results of measuring temperatures by regions of the related art susceptor and the susceptor according to the present invention are compared with each other.

FIG. 9 illustrates the distribution of temperatures by regions of the susceptor before modification (according to a related art) and after modification (according to the present invention) for the bottom surface of the pocket. Here, the wafer is grown in the pocket the inclination angle of the bottom surface of which before modification is 0° and after modification is −0.1 in the inner point. The solid line of the graph illustrates the susceptor (according to the related art) before modification and the dotted line of the graph illustrates the susceptor (according to the present invention) after modification. Since the inner point of the pocket formed in the susceptor has the maximum depth so that the thickness of the susceptor is reduced from the external circumference toward the center, the distribution of temperatures from the center point of the pocket of the susceptor toward the inner point of the pocket of the susceptor increases by ΔT compared with the distribution of temperatures before modification. As a result, a difference in temperature between the regions of the susceptor according to the embodiment is reduced by about 3° C. compared with a difference in temperature between the regions of the related art susceptor.

Figure 10:
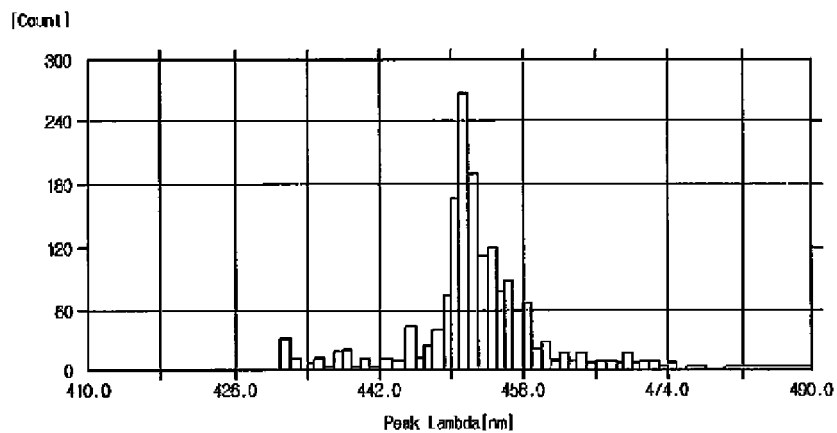
FIGS. 10 and 11 are graphs illustrating elements produced on one wafer and the emission wavelength characteristics of the elements in accordance with the inclinations of the bottom surface of the pocket according to an embodiment of the present invention.
Figure 11:
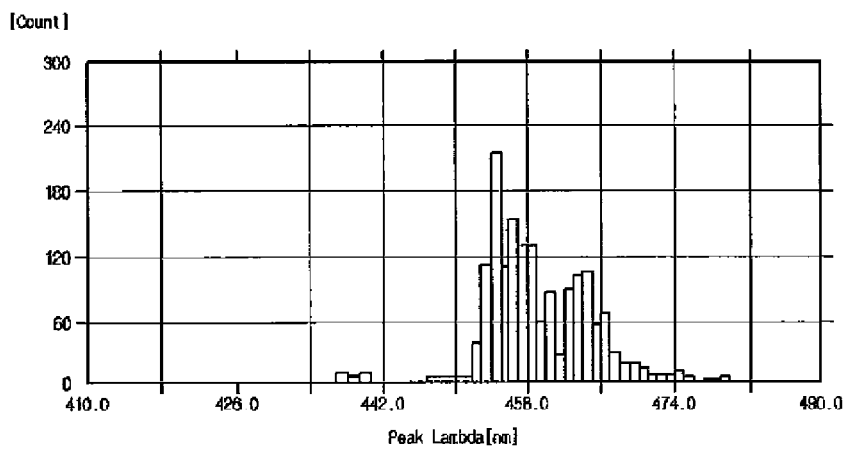

FIGS. 10 and 11 illustrate distribution of wavelengths obtained when a wafer having an area of 2 inches is loaded on the susceptor according to the embodiment, a material layer is formed on the wafer, and the semiconductor light emitting devices produced from the wafer are examined. FIG. 10 illustrates that the inclination angle of the bottom surface of the pocket is −1° in the inner point. FIG. 11 illustrates that the inclination angle of the bottom surface of the pocket is −2° in the outer point. Count of the axes of ordinates of FIGS. 10 and 11 represents the number of measured semiconductor light emitting devices and the axes of abscissa of FIGS. 10 and 11 represent the peak lambda (nm) of the semiconductor light emitting devices.

As illustrated in FIGS. 10 and 11, the output wavelengths of the semiconductor light emitting devices produced from one wafer are commonly distributed based on single wavelengths from 452 nm to 458 nm.

Figure 12:
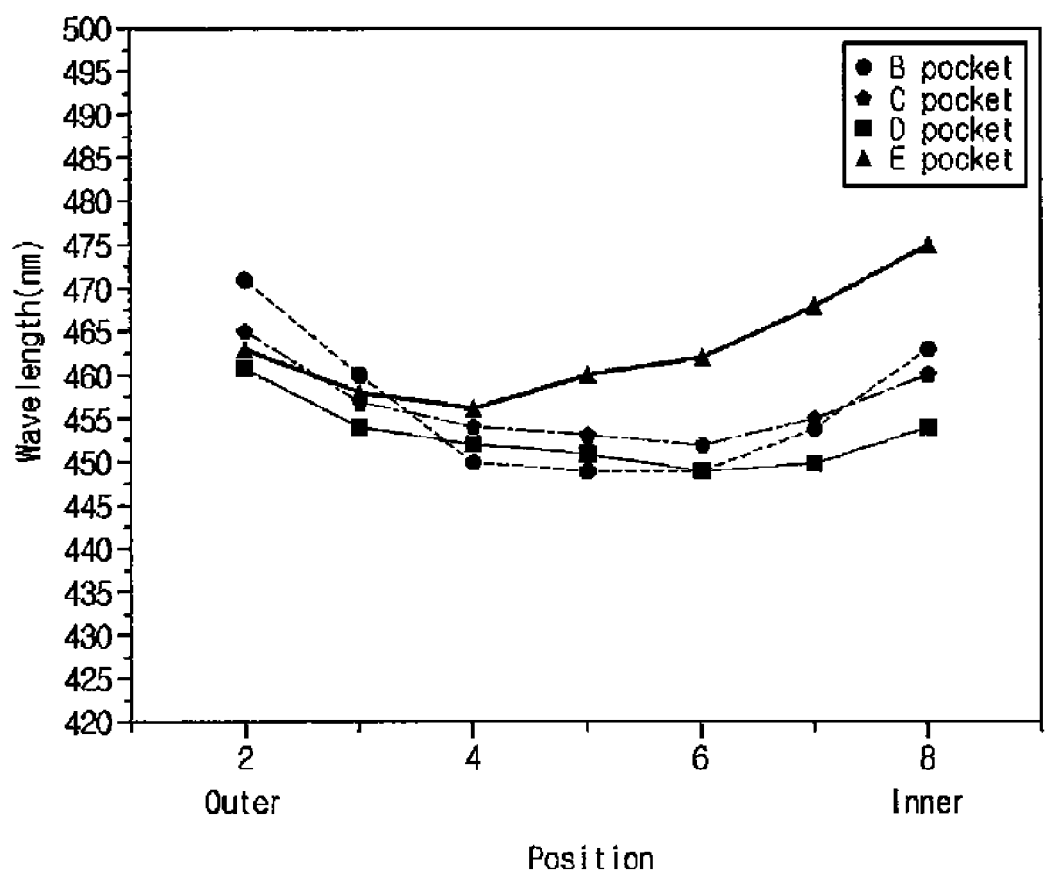
FIG. 12 is a graph illustrating emission wavelength characteristics by regions of a wafer in accordance with the inclinations of the bottom surface of the pocket according to an embodiment of the present invention.

FIG. 12 is a graph illustrating the wavelength characteristics of the semiconductor light emitting devices measured by dividing the wafer grown by the susceptor by a uniform distance. Here, in the axis of abscissa, it is numbered by 2, 4, 6, and 8 from the inner point to the outer point by a uniform distance.

In FIG. 12, the bottom surface of a pocket B is inclined at an angle of −0.5° toward the inner point, the bottom surface of a pocket C is inclined at an angle of −1° toward the inner point, the bottom surface of a pocket D is inclined at an angle of −2° toward the inner point, and the bottom surface of a pocket E is inclined at an angle of −0.5° toward the outer point.

Referring to the graph of FIG. 12, although a difference in wavelength characteristic exists among the pockets B, C, D, and E, the emission characteristics of the produced light emitting diodes become almost the same from the outer region of the wafer toward the inner region of the wafer. Not only the emission wavelength regions but also the operation voltages of the light emitting diodes, which are about 3.0V, are almost the same all over the entire region of the wafer.

As a result, it is possible to reduce a difference in temperature between the regions of the susceptor according to the embodiment compared with a difference in temperature between the regions of the related art susceptor. That is, deviation in temperatures over the entire surface of the wafer is reduced. Since the wafer loaded on the susceptor is heated at the uniform temperature, the material layer is uniformly deposited on the entire region of the wafer so that it is possible to prevent the light emitting diodes having different emission wavelength regions from being produced.

While the invention has been shown and described with reference to certain preferred embodiments thereof, it will be understood by those skilled in the art that various changes in form and details may be made therein without departing from the spirit and scope of the invention as defined by the appended claims.

[Industrial Applicability]

An embodiment and the semiconductor manufacturing apparatus including the same, since heat is uniformly transferred to the wafer, it is possible to form the uniform thin film on the surface of the wafer.

In addition, it is possible to reduce deviation in the electrical/optical characteristics of the semiconductor light emitting devices produced from the wafer loaded on the susceptor and to improve the yield of the semiconductor devices of each wafer.

In addition, since deviation in temperature of the surface of the wafer increases, it is possible to increase the light intensity of the semiconductor light emitting device.

The invention claimed is:

1. A semiconductor manufacturing apparatus comprising:
a reaction chamber;
a heating unit that generates heat in the reaction chamber;
a susceptor on which a wafer is loaded and that includes a plurality of pockets each having a bottom surface that is inclined, wherein the plurality of pockets are disposed on a top surface of the susceptor, and wherein the susceptor is disposed over the heating unit;
a shroud configured to supply source materials to the reaction chamber, wherein the shroud is disposed over the susceptor; and
a rotation shaft coupled with the susceptor, wherein the rotation shaft is disposed under the susceptor,
wherein the top surface of the susceptor is parallel to a bottom surface of the reaction chamber and substantially perpendicular to a flow of the source materials,
wherein an inclination angle of the bottom surface of each pocket is in a range of $0°<\theta\leqq10°$ based on the top surface of the susceptor,
wherein one of the plurality of pockets has a bottom surface having an inclined surface formed so that an inner point is deeper than an outer point, and another of the plurality of pockets has a bottom surface having an inclined surface formed so that an outer point is deeper than the inner point, and
wherein the inner point is referenced to the center of the entire susceptor and the outer point is referenced to the outer periphery of the susceptor.

2. The semiconductor manufacturing apparatus of claim 1, wherein the one of the plurality of pockets has a surface inclined from the center of the susceptor to an outer side of the susceptor, and the another of the plurality of pockets has a surface inclined from the outer side of the susceptor to the center of the susceptor.

3. The semiconductor manufacturing apparatus of claim 1, wherein a depth of the bottom surface of the each pocket is no less than a thickness of the wafer and no more than 10 mm from the top surface of the susceptor.

4. The semiconductor manufacturing apparatus of claim 1, wherein the inclination angles of the bottom surfaces of the plurality of the pockets are equal to each other or different from each other.

5. The semiconductor manufacturing apparatus of claim 1, wherein the reaction chamber includes one of a metal organic chemical vapor deposition (MOCVD) apparatus, a molecular beam epitaxy (MBE) apparatus, and a chemical vapor deposition (CVD) apparatus.

6. The semiconductor manufacturing apparatus of claim 1, wherein the susceptor or the plurality of pockets are formed of or coated with aluminum nitride.

7. The semiconductor manufacturing apparatus of claim 1, wherein each of the plurality of pockets has a flat part and a round part.

8. The semiconductor manufacturing apparatus of claim 7, wherein the flat part is formed on an outer side of the pocket to prevent the wafer from rotating.

* * * * *